United States Patent
Yamauchi

(10) Patent No.: US 10,438,573 B2
(45) Date of Patent: Oct. 8, 2019

(54) SOUND GENERATING DEVICE

(71) Applicant: Murata Manufacturing Co., Ltd., Nagaokakyo-shi, Kyoto-fu (JP)

(72) Inventor: Masakazu Yamauchi, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 403 days.

(21) Appl. No.: 15/414,991

(22) Filed: Jan. 25, 2017

(65) Prior Publication Data

US 2017/0132998 A1 May 11, 2017

Related U.S. Application Data

(63) Continuation of application No. PCT/JP2015/072511, filed on Aug. 7, 2015.

(30) Foreign Application Priority Data

Oct. 31, 2014 (JP) .................................. 2014-222287

(51) Int. Cl.
| | |
|---|---|
| *G10K 9/122* | (2006.01) |
| *G10K 11/22* | (2006.01) |
| *G10K 13/00* | (2006.01) |
| *H01L 41/053* | (2006.01) |

(Continued)

(52) U.S. Cl.
CPC .............. *G10K 9/122* (2013.01); *G10K 9/22* (2013.01); *G10K 11/22* (2013.01); *G10K 13/00* (2013.01); *H01L 41/053* (2013.01); *H01L 41/0973* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,918,738 A | * | 4/1990 | Bader | G10K 9/22 181/155 |
| 2007/0108874 A1 | * | 5/2007 | Okazaki | H04R 17/00 310/348 |

(Continued)

FOREIGN PATENT DOCUMENTS

| | | |
|---|---|---|
| JP | S58-172299 U1 | 11/1983 |
| JP | H10-313499 A | 11/1998 |

(Continued)

OTHER PUBLICATIONS

International Search Report issued for International Application No. PCT/JP2015/072511, dated Sep. 8, 2015.

(Continued)

*Primary Examiner* — Bryan P Gordon
(74) *Attorney, Agent, or Firm* — Arent Fox LLP

(57) ABSTRACT

A sound generating device includes a case and a diaphragm fixed to the inner surfaces of first to fourth side wall portions of the case via a support member. An air chamber surrounded by a top plate, the diaphragm, and portions of the first to fourth side wall portions is formed. A sound emitting chamber that extends between the air chamber and the atmosphere outside of the case terminates at a sound emitting hole which extends across a plurality of surfaces of the case 2.

19 Claims, 10 Drawing Sheets

(51) Int. Cl.
   *H01L 41/09*    (2006.01)
   *G10K 9/22*     (2006.01)

(56) References Cited

U.S. PATENT DOCUMENTS

| | | | | |
|---|---|---|---|---|
| 2011/0176392 A1* | 7/2011 | Fluhrer | ............... | G10K 9/122 |
| | | | | 367/140 |
| 2014/0139071 A1* | 5/2014 | Yamamoto | ............ | G10K 9/122 |
| | | | | 310/322 |
| 2015/0145374 A1* | 5/2015 | Xu | ...................... | B06B 1/0644 |
| | | | | 310/317 |

FOREIGN PATENT DOCUMENTS

| | | |
|---|---|---|
| JP | 2000-032107 A | 1/2000 |
| JP | 2001-199305 A | 7/2001 |
| JP | 2004-328189 A | 11/2004 |

OTHER PUBLICATIONS

Written Opinion of the International Searching Authority issued for International Application No. PCT/JP2015/072511, dated Sep. 8, 2015.

* cited by examiner

SOUND GENERATING DEVICE

CROSS REFERENCE TO RELATED APPLICATIONS

The present application is a continuation of International application No. PCT/JP2015/072511, filed on Aug. 7, 2015, which claims priority to Japanese Patent Application No. 2014-222287, filed on Oct. 31, 2014, the entire contents of each of which are incorporated herein by reference.

TECHNICAL FIELD

The present invention relates to a sound generating device used for informing a sound.

BACKGROUND OF THE INVENTION

In the related art, various sound generating devices have been used for indicating completion of measurement performed by a measuring device and have been used in buzzers and the like. For example, in a sound generating device described in Patent Document 1 (Japanese Unexamined Patent Application Publication No. 2001-199305), a piezoelectric diaphragm is held in a case having an opening that is open upward. The opening is sealed by a cover plate. A bottom plate is disposed below the piezoelectric diaphragm. Acoustic spaces are formed above and below the piezoelectric diaphragm. A sound emitting hole is formed in the above-mentioned cover plate or in a side wall of the case.

In contrast, in a sound generating device described in Patent Document 2 (Japanese Unexamined Patent Application Publication No. 2004-328189), a sound emitting hole is formed in a side wall of a case. A sound emitting pipe having a duct-like shape is formed in the case. The sound emitting pipe is integrally formed with the case. In recent years, measuring devices and the like that are provided with sound generating devices have been reduced in size. Consequently, sound generating devices have been mounted in narrower spaces. In the sound generating device described in Patent Document 1, the sound emitting hole is often formed in the cover plate or in a top plate. Thus, there has been a problem in that, when an inner wall of a case of a measuring device or the like is present in the vicinity of the cover plate or the top plate, the sound pressure decreases due to an increase in air resistance or the like.

In contrast, in the case where a sound emitting hole is formed in a side surface, the sound pressure is less likely to decrease even if a space above the top plate is narrow. However, the sound emitting hole is elongated in a direction toward a side wall of the case, and thus, a sufficient sound pressure cannot be obtained.

Although the sound pressure can be increased by providing the sound emitting pipe having a duct-like shape as described in Patent Document 2, the structure of the sound generating device becomes complex, and two case components are required. In addition, in a configuration in which a sound is emitted toward the side of the case, the sound is less likely to be projected toward the front of the case. That is to say, there is a problem in that the directivity is high.

It is an object of the present invention to provide a sound generating device capable of sufficiently increasing the sound pressure and reducing the directivity of a sound to be emitted even if there is an obstacle in front of a top plate.

BRIEF DESCRIPTION OF THE INVENTION

A sound generating device in accordance with the principles of the present invention includes a case that includes a top wall and a side wall extending downwardly from the top wall. A diaphragm is fixed to an inner surface of the case at a location spaced from the top wall and cooperates with the top wall and the side wall to bound an air chamber. A sound emitting hole extends through both the top wall and the side wall and is in gaseous communication with the air chamber for allowing sound waves located in the air chamber to exit the case.

In preferred embodiments a duct that extends from the air chamber to the sound emitting hole and allows sound waves located in the air chamber to travel to the sound emitting hole. The duct can extend, for example, along the side wall or the top wall of the case. In some embodiments, at least a portion of the duct protrudes outward from the side wall of the case. In other embodiments, at least a portion of the duct protrudes above the top wall of the case. The duct preferably has a rectangular cross section.

In a preferred embodiment the duct includes first and second opposed walls, one of the opposed walls being defined by the top wall of the case. In another embodiment, the side wall has a plurality of planar wall sections and the sound emitting hole extends through at least two of the wall sections. In preferred embodiments there are four wall sections and the sound emitting hole extends through two adjacent wall sections at a corner at which the two adjacent wall sections meet.

The diaphragm is preferably a piezoelectric diaphragm that performs bending vibration. The case preferably has an open bottom end and the diaphragm cooperates with a portion of the side wall of the case located between the diaphragm and the open lower end to form a second air chamber. At least one additional sound emitting hole extends through the portion of the side wall of the case located between the diaphragm and the open lower end to allow sound waves located in the second air chamber to exit the case.

The top wall preferably has a rectangular shape having four sides when viewed in plan view. The side wall includes first to fourth side wall portions, each extending from a respective one of the sides of the top wall.

In another embodiment, the top plate has a circular shape when viewed in plan view and the side wall is a cylindrical side wall.

In certain embodiments, the sound emitting hole extends from the top surface of the top wall downwardly along the side surface of the side wall by a distance of at least 0.5 mm.

DESCRIPTION OF THE PREFERRED EMBODIMENTS

The embodiments described in the present specification are examples only. Without limitation, configurations according to the different embodiments may be partially replaced with one another or may be combined with each other.

Figure 1:
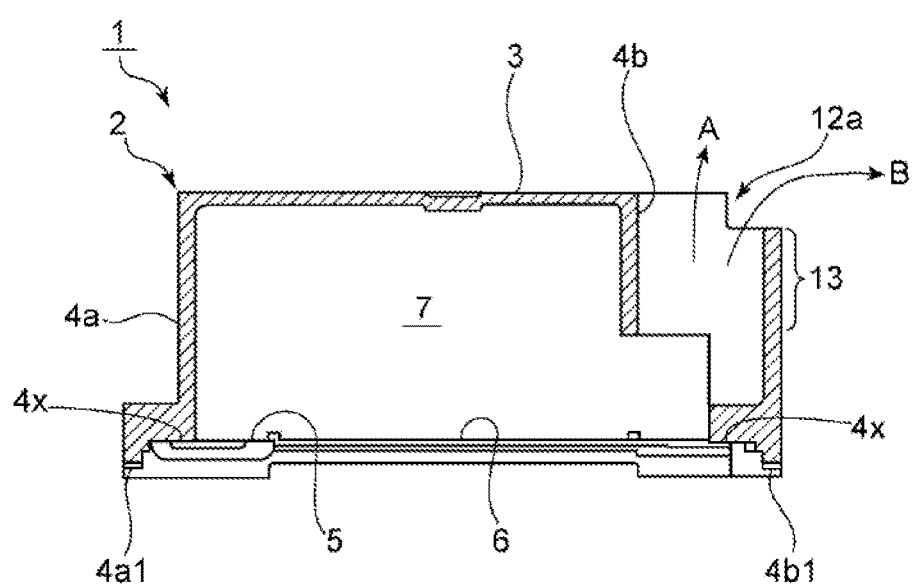
FIG. 1 is a cross-sectional front view of a sound generating device according to a first embodiment of the present invention.
Figure 2:
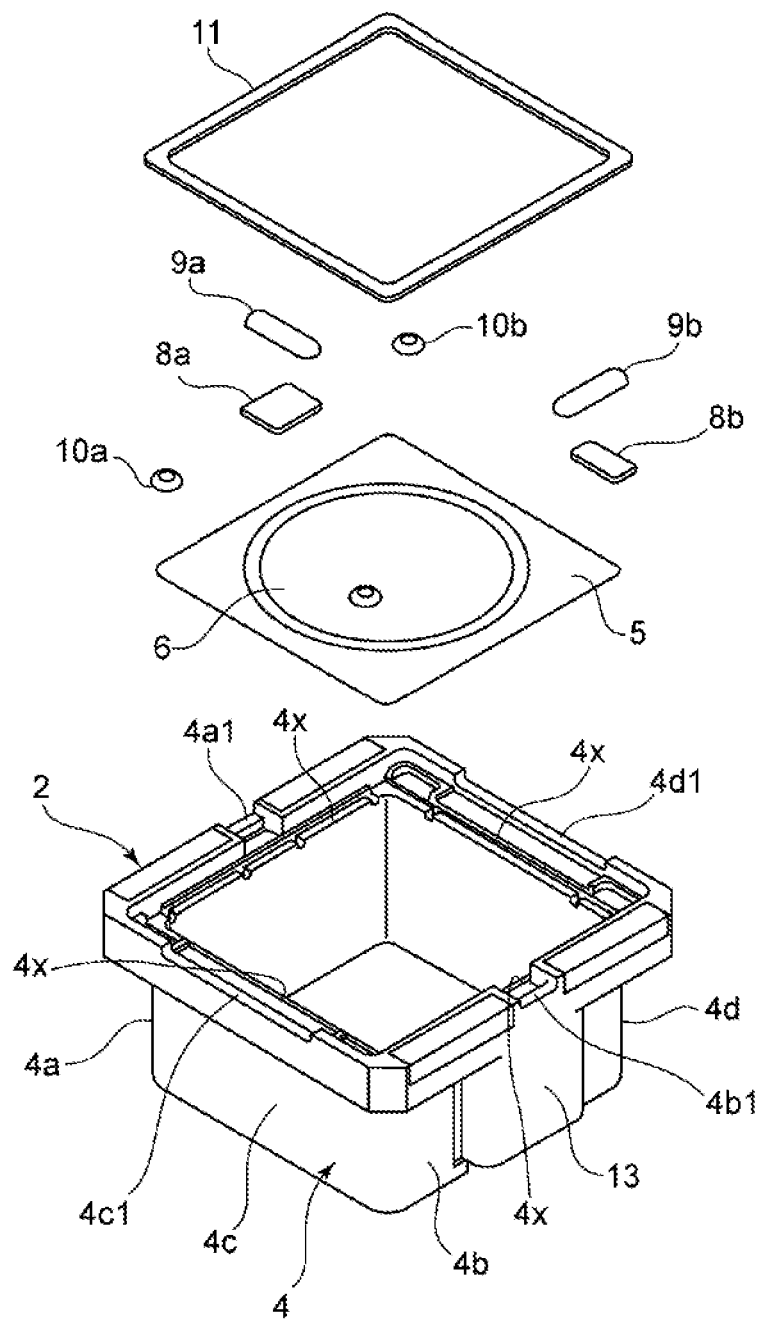
FIG. 2 is an exploded perspective view of the sound generating device according to the first embodiment of the present invention as viewed from below.
Figure 3:
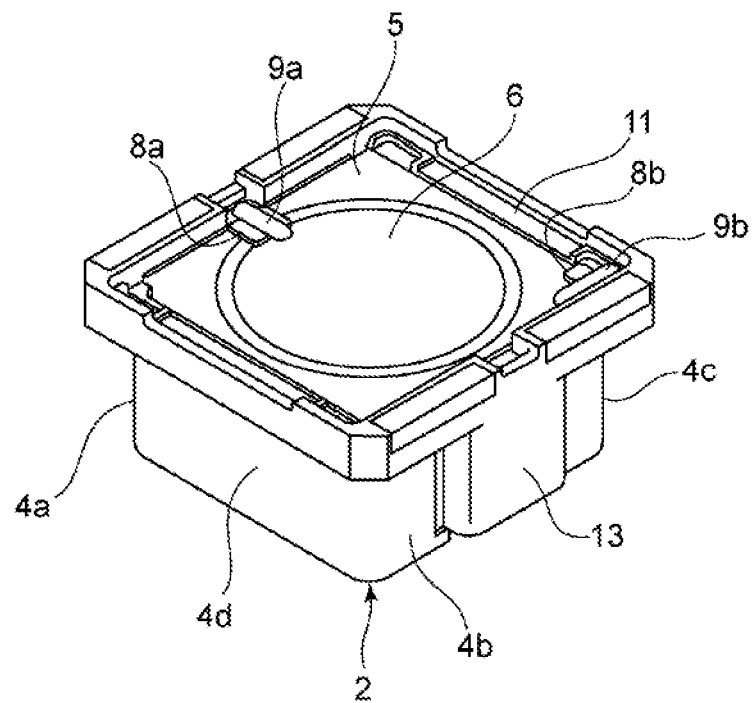
FIG. 3 is a perspective view of the sound generating device according to the first embodiment of the present invention as viewed from below.
Figure 4:
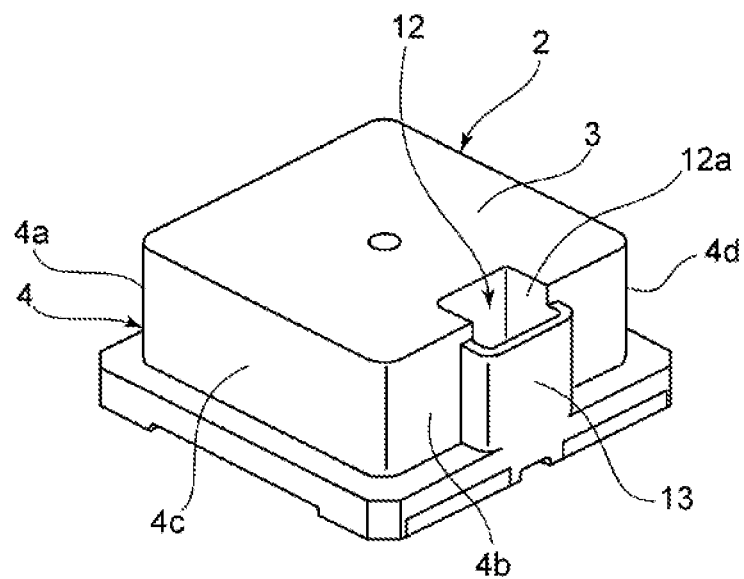
FIG. 4 is a perspective view of the sound generating device according to the first embodiment of the present invention.

FIG. 1 is a cross-sectional front view of a sound generating device according to a first embodiment of the present invention. FIG. 2 is an exploded perspective view of the sound generating device as viewed from below. FIG. 3 is a perspective view of the sound generating device as viewed from below. FIG. 4 is a perspective view of the sound generating device according to the first embodiment.

A sound generating device 1 includes a case 2. The case 2 is made of a suitable metal, a synthetic resin, or the like.

The case 2 includes a top wall 3 and a side wall 4. The side wall is divided into first to fourth side wall portions 4a to 4d. Each side wall portion extends from a respective outer edge of the top wall 3 in a direction away from the top wall 3. When viewed in plan view, the top wall 3 has a rectangular planar shape. The first to fourth side wall portions 4a to 4d are each provided so as to extend downward from a corresponding one of the sides of the rectangle. Step portions 4x are formed below the first to fourth side wall portions 4a to 4d. A support member 5 is attached to the inner surfaces of the first to fourth side wall portions 4a to 4d at the step portions 4x. In addition, the support member 5 has a circular opening formed at the center thereof, and a piezoelectric diaphragm 6, which serves as a diaphragm, is attached so as to obstruct the opening.

The piezoelectric diaphragm 6 is preferably formed of any commonly known piezoelectric vibration element, and in the present embodiment, the piezoelectric diaphragm 6 is configured to vibrate in a bending mode. The support member 5 is preferably made of a synthetic resin, a metal, or the like.

A space bounded by the piezoelectric diaphragm 6, the top plate 3, and the first to fourth side wall portions 4a to 4d defines an air chamber 7 serving as an acoustic space. The bottom of the case located below the piezoelectric diaphragm 6 is open. Thus, the sound generating device 1 does not include a bottom plate.

A duct 13 is provided so as to extend from the air chamber 7 to a location outside the case 2. The duct 13 is preferably formed of a cylindrical or parallel piped body and is integrally formed with the case 2. In this embodiment, a portion of the duct 13 protrudes outward from the second side wall portion 4b. The duct 13 forms a sound emitting chamber 12. By extending the duct 13 to a sound emitting hole 12, the sound pressure can be increased.

Note that, during assembly, the piezoelectric diaphragm 6, which is integrated with the support member 5, is preferably placed onto the step portions 4x while the case 2 is turned upside down as illustrated in FIG. 2. After that, the piezoelectric diaphragm 6 is electrically connected to an external terminal (not illustrated) using elastic support members 8a and 8b, each of which is preferably made of rubber or the like, and conductive adhesive portions 9a and 9b, and the support member 5 is fixed onto the case 2.

Subsequently, adhesive portions 10a and 10b for temporary adhesion are applied onto the support member 5. Then, an elastic sealing member 11 having a frame-like shape is fixed onto the outer peripheral edge of the above-mentioned support member 5. As a result, the support member 5, which is integrated with the piezoelectric diaphragm 6, is fixed in place by being sandwiched by the step portions 4x of the case 2 and the elastic sealing member 11.

When the above-mentioned piezoelectric diaphragm 6 performs bending vibration, air is caused to vibrate in the air chamber 7, and this vibration is transmitted through the sound emitting chamber 12 and emitted as a sound via opening 12a to the atmosphere outside of the case 2. The volume of the sound increases at a frequency at which the air chamber 7 and the sound emitting chamber 12 resonate with each other.

A feature of the present embodiment is that the opening 12a of the sound emitting hole 12 extends across both the top plate 3 of the case 2 and the second side wall portion 4b, that is, a plurality of surfaces.

Since the opening 12a of the sound emitting chamber 12 extends across both a portion of the top plate 3 and a portion of the second side wall portion 4b, the sound pressure can be increased. This effect will now be specifically described with reference to FIG. 1.

The opening 12a of the sound emitting chamber 12 corresponds to a boundary portion between the sound emitting chamber 12 and the atmosphere outside the case 2. As is clear from FIG. 1 and FIG. 4, the opening 12a includes a first portion preferably formed by cutting out a portion of the top plate 3 and a second portion preferably formed by cutting out a portion of the second side wall portion 4b. Accordingly, sound is projected not only upward with respect to the top plate 3 as indicated by arrow A in FIG. 1, but also in a direction approximately parallel to the top plate 3 as indicated by arrow B.

Consequently, even in the case where a wall surface or the like of a device on which the sound generating device 1 is to be mounted is located in front of the top plate 3, the sound radiates in the direction indicated by arrow B, and thus, even if there is an obstacle in front of the top plate 3, the sound pressure of the emitted sound can be sufficiently increased. In addition, the duct 13 defines a further resonant cavity, the sound pressure can be further increased. Furthermore, as described above, the sound is emitted as indicated by arrows A and B, and thus, the directivity can be reduced in the sound generating device 1.

In addition, in the sound generating device 1, since the duct 13 may be formed integrally with the case 2, which has the above-mentioned sound emitting hole 12, the sound pressure can be sufficiently increased with a relatively simple structure without increasing the number of components.

As illustrated in FIG. 2, cutout portions 4a1 to 4d1, which are open downward, are formed at the center of lower end portions of the first to fourth side wall portions 4a to 4d, respectively. Accordingly, as in a second embodiment, which will be described later and which is illustrated in FIG. 5(b), in the case where the sound generating device 1 is mounted on a case substrate or a mounting substrate, the cutout portions 4a1 to 4d1 function as sound emitting holes. Thus, a second air chamber is formed on the side opposite to the side on which the air chamber 7 is formed with the piezoelectric diaphragm 6 interposed therebetween, and the sound pressure can be further increased.

Note that a resin may preferably be used as the material of the above-described case 2. In this case, the case 2 including metallic particles can be easily formed by a molding method, such as insert molding. As such a resin, syndiotactic polystyrene (SPS), polyphenylene sulfide (PPS), polybutylene terephthalate (PBT), a liquid crystal polymer (LCP), or the like can be used.

A suitable elastic adhesive can be used as the above-mentioned elastic support members 8a and 8b. A urethane-based adhesive or the like can preferably be used. A suitable conductive adhesive can be used as the above-mentioned conductive adhesive portions 9a and 9b. A silicone-based adhesive or the like can preferably be used as the above-mentioned elastic sealing member 11 in order to suppress damping.

The above-mentioned piezoelectric diaphragm 6 can be formed of a suitable piezoelectric diaphragm that vibrates in the bending mode. For example, an electrode may be formed on one or two surfaces of a metal plate, or a piezoelectric element having an electrode formed on a surface thereof, the surface being located on the side opposite to the side on which a metal plate is present, may be attached to one surface or the two surfaces of the metal plate. As such a piezoelectric element, a device made of a suitable piezoelectric material, such as a device in which a piezoelectric ceramic is used, can be used.

FIG. 5(a) and FIG. 5(b) are a perspective view of a sound generating device according to the second embodiment of the present invention and a partially cut-away cross-sectional front view schematically illustrating a structure in which the sound generating device has been mounted on a device.

As illustrated in FIG. 5(a), sound generating device 21 includes a case 22 having a top plate 23 and first to fourth side wall portions 24a to 24d. The difference from the case 2 used in the first embodiment is that, in the case 22, a duct 25 is formed by using the second side wall portion 24b so as not to protrude from the second side wall portion 24b. The duct 25 preferably has a rectangular cross-sectional shape, and one surface of the rectangular cross-sectional shape is defined by the second side wall portion 24b.

Also in the present embodiment, an opening 26a of a sound emitting chamber 26 is formed so as to extend across both the top plate 23 and the second side wall portion 24b. As illustrated in FIGS. 5(a) and 5(b), the opening 26a is preferably formed by cutting out a portion of both the top plate 23 and an upper end portion of the second side wall portion 24b.

As shown in FIG. 5(b), in the case where the sound generating device 21 is mounted onto a device 31 that includes a mounting substrate 33 and a case wall 32, sound is emitted in both the direction indicated by arrow A and the direction indicated by arrow B. As indicated by arrow B, the sound is radiated laterally from a portion formed by cutting out the second side wall portion 24b of the case 22. Therefore, even if the case wall 32 is present as an obstacle in front of the top plate 23, a high sound pressure can be obtained as in the first embodiment.

The rest of the structure of the sound generating device 21 is similar to that of the sound generating device 1, and thus descriptions thereof will be omitted by incorporating the description of the first embodiment.

As illustrated in FIG. 5(a), cutout portions 24b1 and 24c1 are preferably formed at the center of lower end portions of the second and third side wall portions 24b and 24c, respectively. Similarly, as illustrated in FIG. 5(b), cutout portions 24a1 and 24d1 are preferably formed at the center of lower end portions of the first and fourth side wall portions 24a and 24d, respectively.

The first to fourth side wall portions 24a to 24d are in contact with the mounting substrate 33, so that the sound generating device 21 is fixed to the mounting substrate 33. Accordingly, in the structure illustrated in FIG. 5(b), the air chamber 7 forms a first acoustic space, and in addition, a second air chamber 7A surrounded by the piezoelectric diaphragm 6, the mounting substrate 33, and lower portions of the first to fourth side wall portions 24a to 24d is formed below the piezoelectric diaphragm 6. Thus, in the present embodiment, a sound can be obtained from the sound emitting hole 26, and in addition, the sound pressure generated by resonance in the second air chamber 7A can be obtained from the above-mentioned cutout portions 24a1, 24b1, 24c1, and 24d1. Therefore, according to the mounting structure illustrated in FIG. 5(b), the sound pressure at a desired frequency can be increased, and the sound quality can be improved by using the second air chamber.

FIG. 6(a) and FIG. 6(b) are perspective and partially cut away cross-sectional views of a sound generating device according to a third embodiment of the present invention schematically illustrating a state where the sound generating device has been mounted on a device.

In sound generating device 41, the air chamber 7 is configured in a similar manner to that of the sound generating device according to the first embodiment. Note that no duct is provided in the sound generating device 41, and the air chamber 7 is in direct communication with a sound emitting hole 45. Also in the present embodiment, a sound emitting opening 45a is formed so as to extend across a top plate 43 and a second side wall portion 44b. More specifically, the opening 45a extends into the top plate 43 by an amount equal to the thickness of the second side wall portion 44b and also preferably extends to the second side wall portion 44*b* by preferably cutting out an upper end portion of the second side wall portion 44*b*.

The sound generating device 41 is configured in a similar manner to the sound generating devices 1 and 21, except with regard to the matter described above. Therefore, description of the rest of the structure of the sound generating device 41 will be omitted by incorporating the descriptions of the first and second embodiments.

Figure 6:
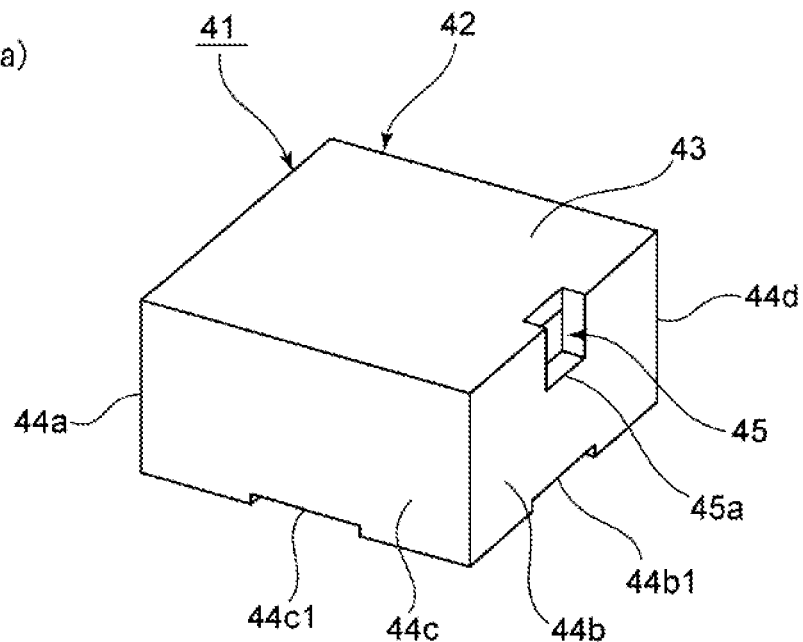
FIG. 6(a) and FIG. 6(b) are a perspective view of a sound generating device according to a third embodiment of the present invention and a partially cut-away cross-sectional front view schematically illustrating a structure in which the sound generating device has been mounted on a device.
Figure 6:
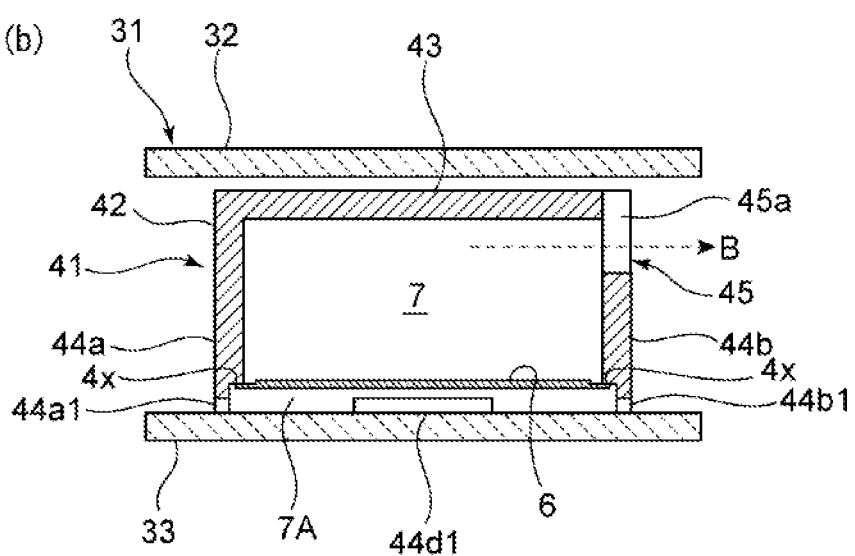

Also in the sound generating device 41, as illustrated in FIG. 6(*b*), even in the case where the case wall 32 of the device 31 is present as an obstacle in front of the top plate 43, a sound can be laterally emitted as indicated by arrow B. Therefore, even if there is an obstacle in front of the top plate 43, a sufficient sound pressure can be generated.

Also in the structure illustrated in FIG. 6(*b*), the second air chamber 7A is formed between the piezoelectric diaphragm 6 and the mounting substrate 33. Accordingly, the sound pressure generated in the second air chamber 7A can radiate laterally outward from the second air chamber 7A via the cutout portions 44*a*1 to 44*d*1. Therefore, a higher sound pressure can also be obtained in the sound generating device 41.

Figure 5:
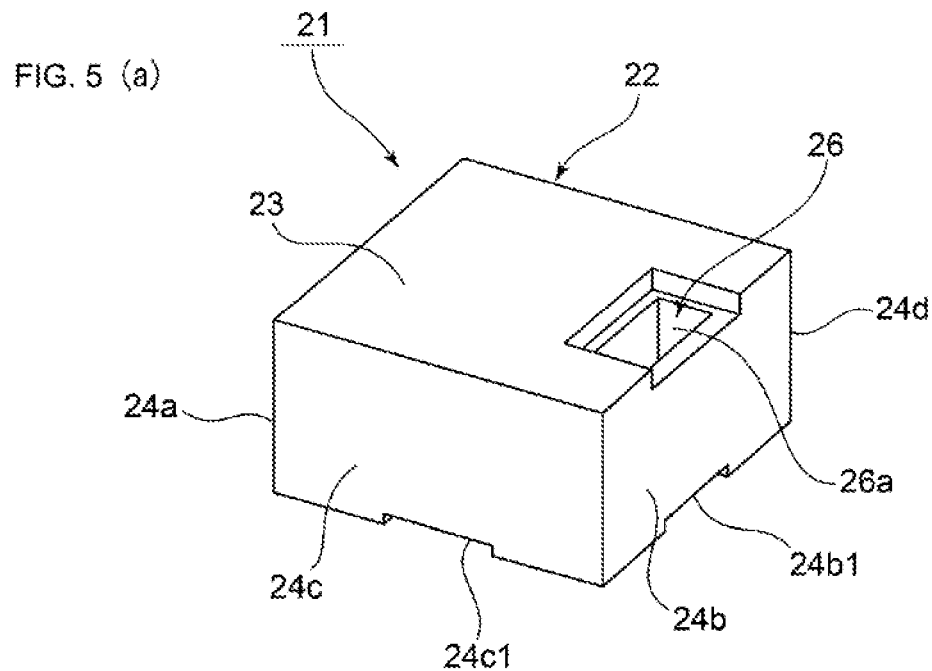
FIG. 5(a) and FIG. 5(b) are a perspective view of a sound generating device according to a second embodiment of the present invention and a partially cut-away cross-sectional front view schematically illustrating a structure in which the sound generating device has been mounted on a device.
Figure 5:
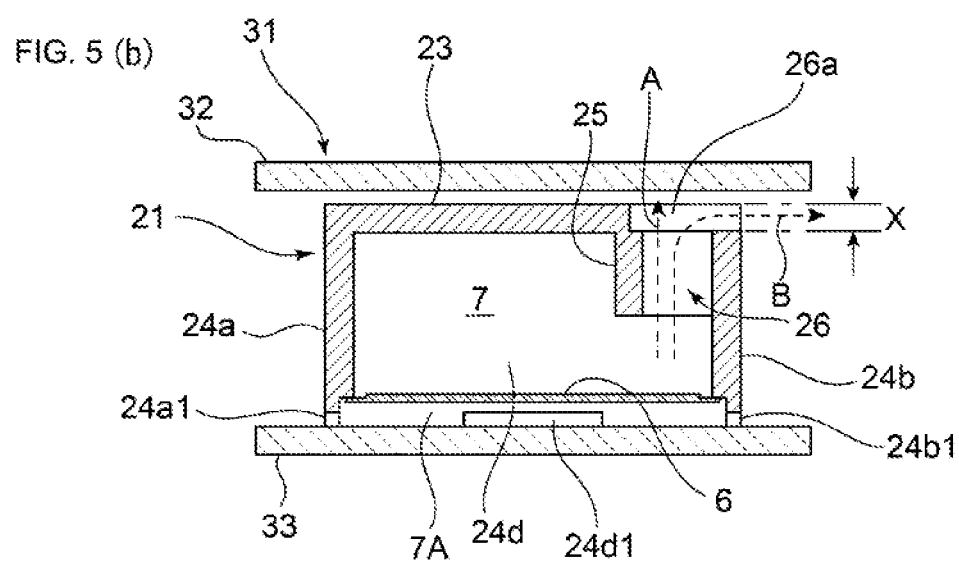
Figure 7:
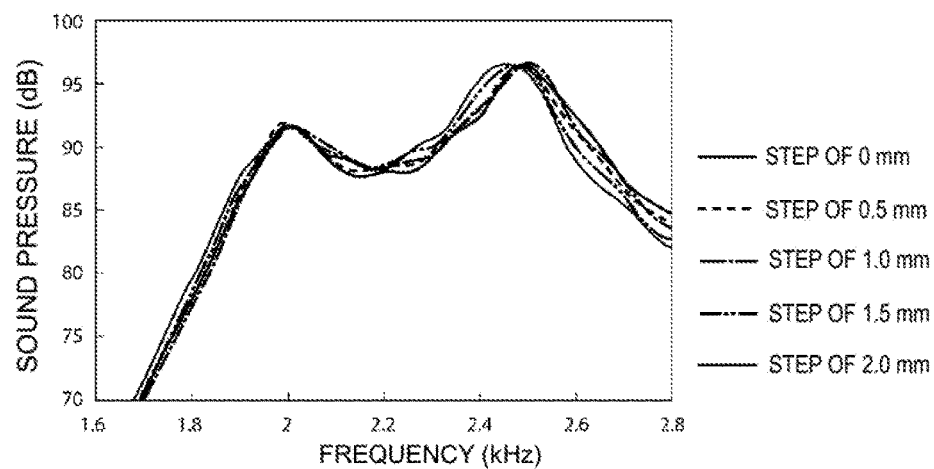
FIG. 7 is a graph representing the relationship between frequency and sound pressure when the size of a step portion of an opening of a sound emitting hole is varied in the sound generating device according to the second embodiment.

FIG. 7 is a graph representing the relationship between frequency and sound pressure when the size of a step portion X in the opening 26*a* of the sound emitting hole 26 (i.e., the length of the height along side wall 24*b*—the vertical dimension in FIG. 5(*a*)) is varied in the sound generating device 21 according to the second embodiment. Here, there is no shielding object disposed in front of the sound generating device 21, and the step portion X is set to 0 mm, 0.5 mm, 1.0 mm, 1.5 mm, or 2.0 mm. The structure in which the step portion X is set to 0 mm does not correspond to any of the embodiments and is a structure in which the opening 26*a* of the sound emitting hole 26 is formed only in the top plate 23.

As is clear from FIG. 7, it is understood that peaks of the sound pressure appear in the vicinity of 2 kHz and in the vicinity of 2.47 kHz in all the cases where the step portion X is set to one of the above values.

Figure 8:
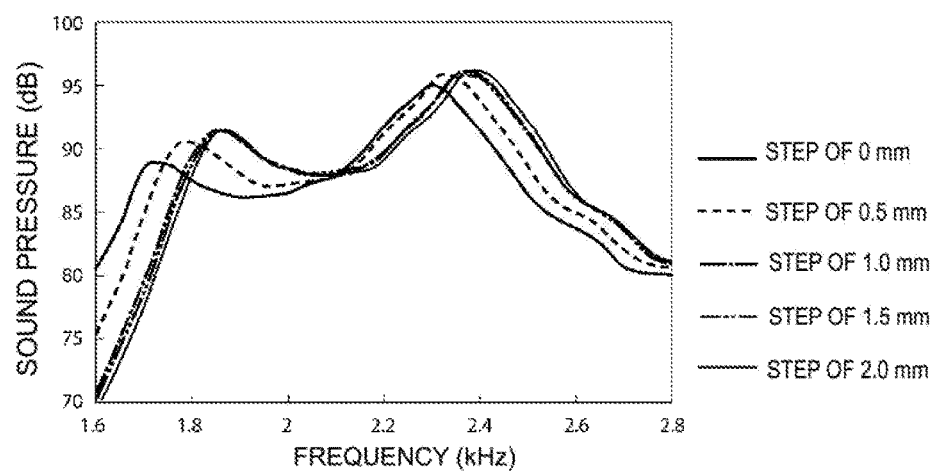
FIG. 8 is a graph representing the relationship between frequency and sound pressure when the size of the step portion of the opening of the sound emitting hole is varied while a shielding object is disposed in front of a top plate in the sound generating device according to the second embodiment.

In contrast, FIG. 8 is a graph representing the relationship between frequency and sound pressure when a plate-shaped shielding object larger than the top plate 23 is disposed in front of the top plate 23 at a distance of 0.5 mm as illustrated in FIG. 5(*b*). Also FIG. 8 represents the results in each of the cases where the step portion X is set to 0 mm, 0.5 mm, 1.0 mm, 1.5 mm, or 2.0 mm.

As is clear from FIG. 8, in the case where a shielding object is present in front of the top plate 23, when the step portion X is set to 0 mm, it is understood that peaks of the sound pressure are relatively small, and in addition, both the frequency positions of the peaks of the sound pressure are shifted toward the low frequency side. Conversely, when the step portion X is set to 0.5 mm or larger, it is understood that such a decrease in the sound pressure is less likely to occur and there is only a small shift of the peak positions of the sound pressure.

Figure 9:
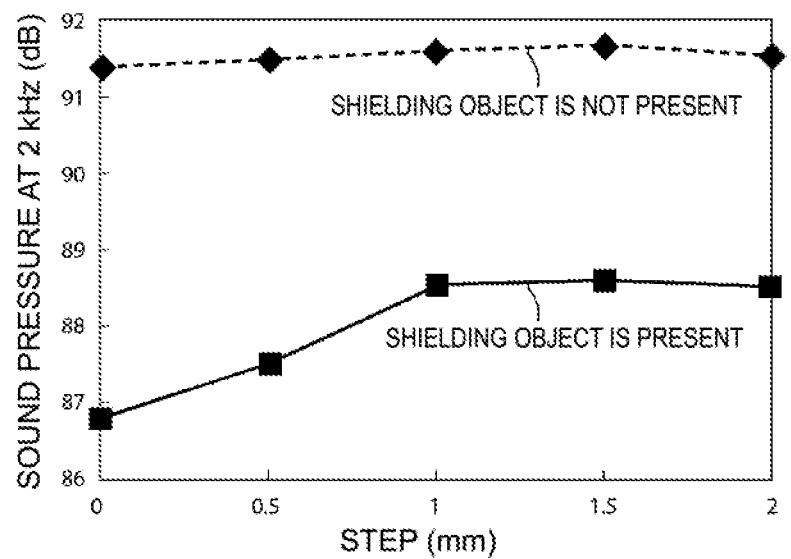
FIG. 9 is a graph representing the relationship between the size of the step portion of the opening of the sound emitting hole and sound pressure at 2 kHz in the case where a shielding object is present in front of the top plate and in the case where a shielding object is not present in front of the top plate in the sound generating device according to the second embodiment.

FIG. 9 is a graph representing, by using the relationship between the size of the step portion and sound pressure at 2 kHz, the results in FIG. 7 and FIG. 8. In FIG. 9, a solid line represents the results in the case where a shielding object is present, and a dashed line represents the results in the case where a shielding object is not present. As is clear from FIG. 9, in the case where a shielding object is present in front of the top plate 23, when the step portion is set to 0 mm, it is understood that the sound pressure decreases markedly, whereas in the case where a shielding object is not present, the sound pressure does not markedly decrease. It is understood that a decrease in the sound pressure is significantly suppressed when the step portion is set to 0.5 mm or larger, and more preferably, that a decrease in the sound pressure can be more effectively suppressed when the step portion is set to 1.0 mm or larger. In addition, it is understood that the effect of suppressing a decrease in the sound pressure is not significantly improved even when the step portion X is set to be larger than 1.0 mm.

Accordingly, it is preferable that the dimension of the above-mentioned step portion X be 1.0 mm or larger. Therefore, it is understood that a sufficient sound pressure can be obtained even in the case where a shielding object is present in front of the top plate 23 by forming the opening 26*a* such that the step portion X of the opening 26*a* has a sufficient size, that is, such that the opening 26*a* extends across both the top plate 23 and the second side wall portion 24*b*.

Figure 10:
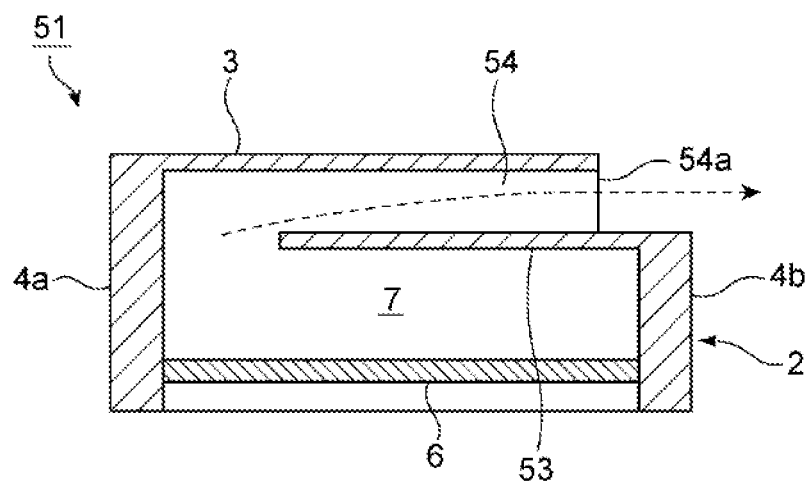
FIG. 10 is a schematic cross-sectional front view of a sound generating device according to a fourth embodiment of the present invention.
Figure 11:
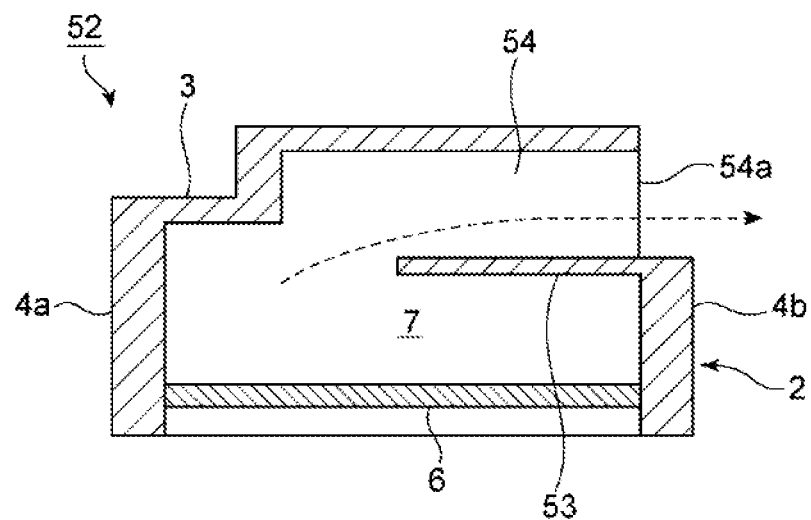
FIG. 11 is a schematic cross-sectional front view of a sound generating device according to a fifth embodiment of the present invention.

FIG. 10 and FIG. 11 are respective schematic cross-sectional front views illustrating a sound generating device according to fourth and fifth embodiments of the present invention. In the sound generating device 1 according to the first embodiment and in the sound generating device 21 according to the second embodiment, the duct 13 is disposed so as to extend along the second side wall portion 4*b*, that is, to extend in the vertical direction perpendicular to the top plate 3, and the duct 25 is disposed so as to extend along the second side wall portion 24*b*, that is, to extend in the vertical direction perpendicular to the top plate 23. However, a sound generating device 51 according to the fourth embodiment illustrated in FIG. 10 and a sound generating device 52 according to the fifth embodiment illustrated in FIG. 11, includes duct 54 (defining a sound emitting chamber) which extends along the top plate 3 of the case 2. In sound generating device 51, the duct 53 does not protrude above the top plate 3, and a portion of the top plate 3 forms a portion of the duct 53. In contrast, in the sound generating device 52 illustrated in FIG. 11, the duct 53 (defining a sound emitting chamber) is disposed such that a portion of the duct 53 protrudes above the top plate 3.

In other words, the duct 53, which extends along the top plate 3, may protrude from a portion of the top plate 3. The rest of the configurations of the sound generating devices 51 and 52 can be similar to those described in the first and second embodiments.

In the present invention, for example, as shown in the sound generating devices 51 and 52, the duct 53 extending to the air chamber 7 may extend in a direction along the top plate 3, that is, a direction parallel to the main surface of the piezoelectric diaphragm 6. Also in this case, an opening 54*a* of a sound emitting hole 54 formed in the duct 53 is formed so as to extend across both the top plate 3 and the second side wall portion 4*b*. Thus, advantageous effects similar to those of the sound generating device 1 according to the first embodiment and those of the sound generating device 21 according to the second embodiment may be obtained.

Figure 12:
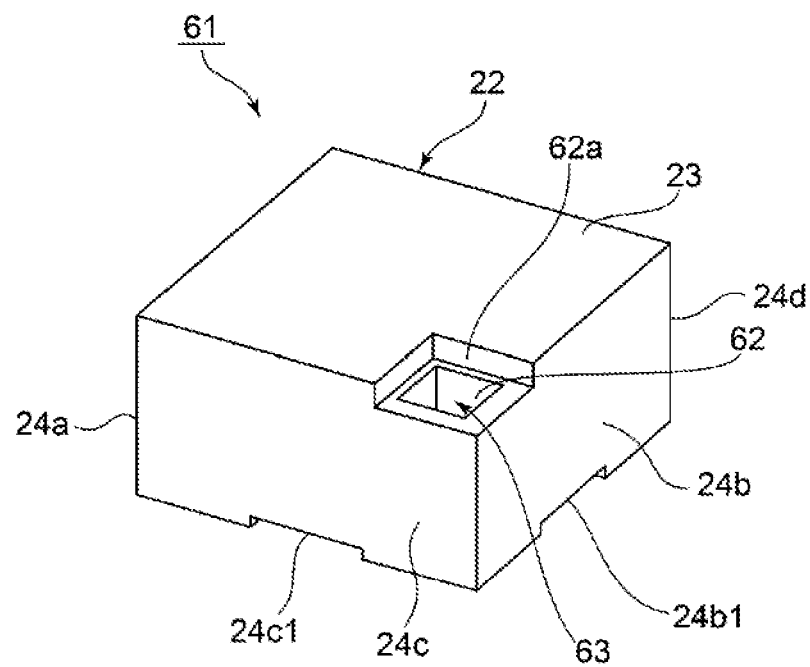
FIG. 12 is a perspective view of a sound generating device according to a sixth embodiment of the present invention.

In a sound generating device 61 according to the sixth embodiment illustrated in FIG. 12, the duct 63 forms a sound emitting chamber 62. An opening 62*a* of the sound emitting chamber 62 is formed so as to extend across the top plate 3 as well as the second and third side wall portions 4*b* and 4*c*. As is clear from FIG. 12, the opening 62*a* is formed by cutting out (or otherwise removing or simply not forming) a portion of the top plate 3 and portions of the second and third side wall portions 4*b* and 4*c*. Thus, the opening 62*a* extending across three surfaces is formed at a corner portion of the top plate 3. As described above, the opening of the sound emitting chamber according to the present invention may be formed so as to extend across three or more surfaces.

The rest of the configuration of the sound generating device 61 is similar to those of the sound generating device 21, and thus, advantageous effects similar to those of the sound generating device 21 may be obtained. In the present embodiment, since the opening 62a extends across three surfaces, a sound can be emitted in a wider range, and a larger sound pressure can be obtained even if a shielding object is present in front of the top plate 23.

Figure 13:
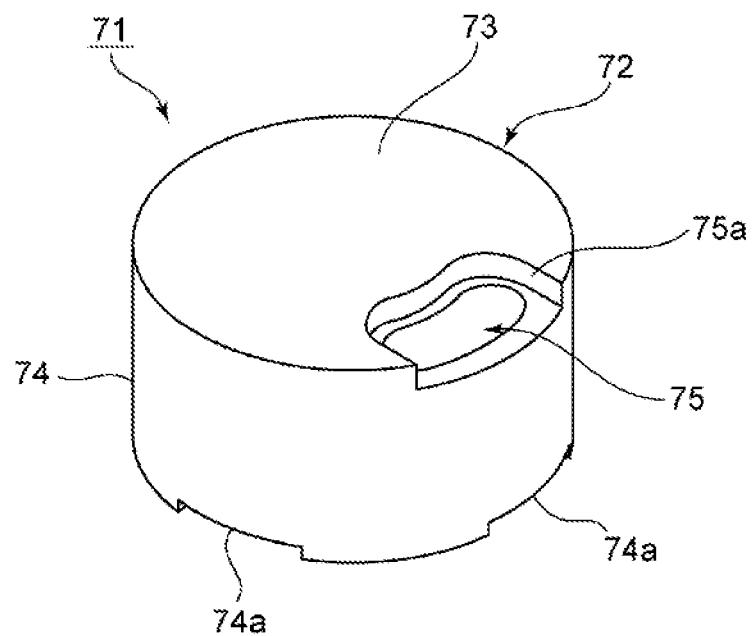
FIG. 13 is a perspective view of a sound generating device according to a seventh embodiment of the present invention.

FIG. 13 is a perspective view of a sound generating device according to a seventh embodiment. In sound generating device 71, when viewed in plan view, a case 72 includes a top plate 73 having a circular plate-like shape. A side wall 74 is disposed so as to extend in a direction downwardly from the outer edge of the top plate 73. The side wall 74 has a cylindrical shape. As described above, in the present invention, the case 72 may have a cylindrical shape one of whose openings is obstructed by the top plate 73.

In the sound generating device 71, an opening 75a of a sound emitting chamber 75 is formed so as to extend across the top plate 73 and the side wall 74. Therefore, advantageous effects similar to those of the sound generating devices according to the first and second embodiments may be obtained.

Note that, similar to the above-mentioned cutout portions 4a1 to 4d1 and cutout portions 24a1 and 24b1, a plurality of cutout portions 74a and 74a illustrated in FIG. 13 form sound emitting chambers of a second air chamber located below the piezoelectric diaphragm 6.

Figure 14:
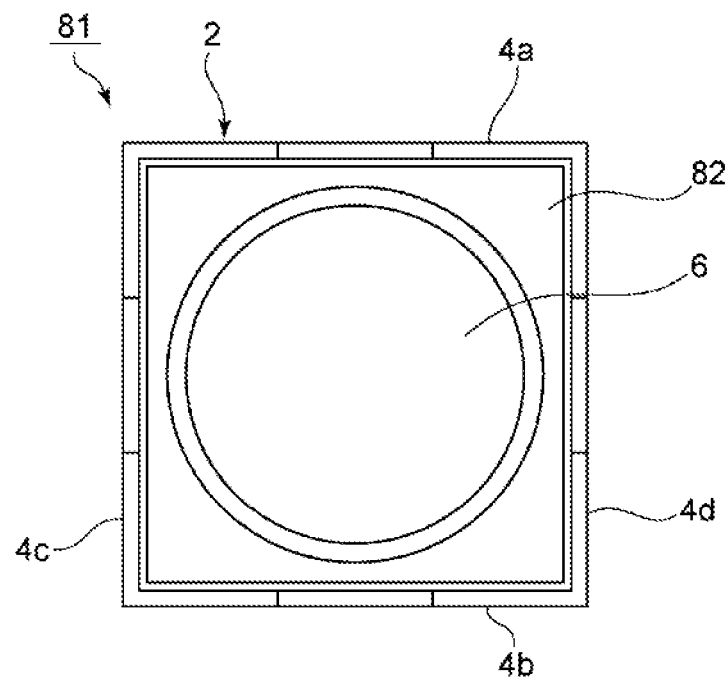
FIG. 14 is a bottom view of a sound generating device according to an eighth embodiment of the present invention.
Figure 15:
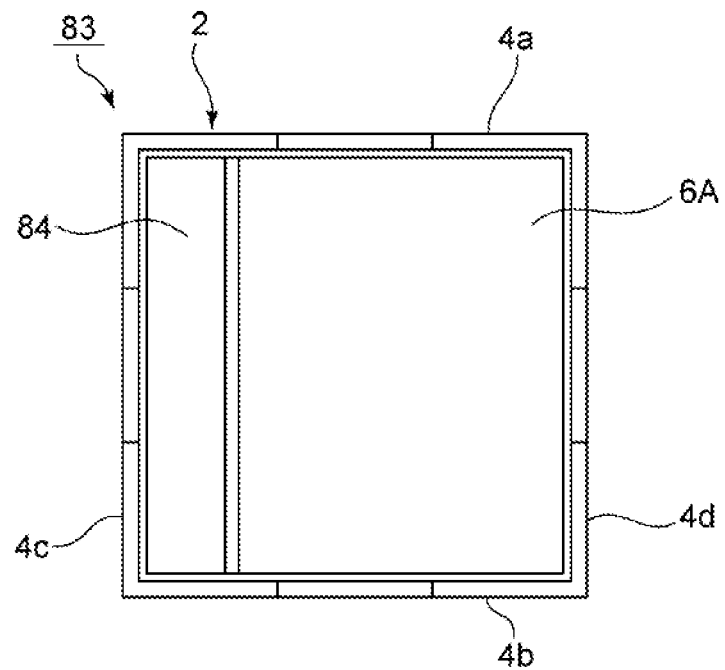
FIG. 15 is a bottom view of a sound generating device according to a ninth embodiment of the present invention.
Figure 16:
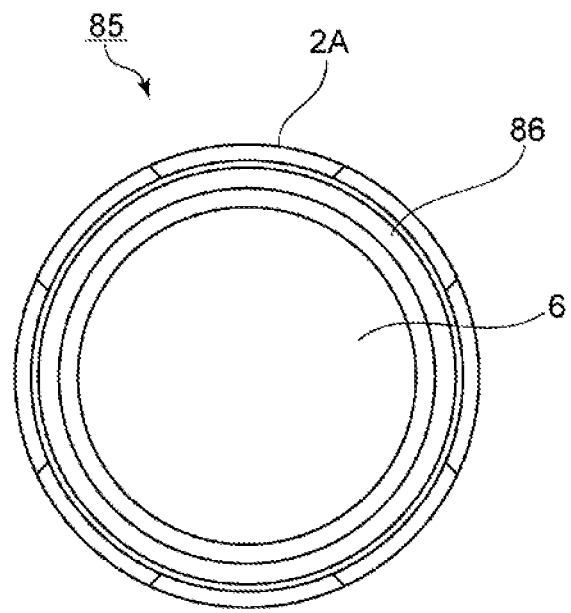
FIG. 16 is a bottom view of a sound generating device according to a tenth embodiment of the present invention.

FIG. 14 to FIG. 16 are bottom views respectively illustrating sound generating devices according to eighth to tenth embodiments of the present invention. In the case where openings that are formed in lower portions of the first to fourth side wall portions 4a to 4d of the case 2 each have a rectangular shape when viewed in plan view as in a sound generating device 81 illustrated in FIG. 14, a structure in which the piezoelectric diaphragm 6 having a circular shape is supported by a support member 82 whose outer peripheral edge has a rectangular shape may be employed. In addition, in a structure in which the first to fourth side wall portions 4a to 4d are arranged so as to have a rectangular opening as in a sound generating device 83 illustrated in FIG. 15, a piezoelectric diaphragm 6A having a rectangular shape may be fixed onto the case 2 by using a support member 84.

Furthermore, as in a sound generating device 85 illustrated in FIG. 16, in a case 2A that includes a side wall having a cylindrical shape, a piezoelectric diaphragm 6 having a disc-like shape may be supported and fixed in place by a support member 86 whose outer peripheral edge has a circular shape.

In other words, as illustrated in FIG. 14 to FIG. 16, in the present invention, the shape of the side wall in plan view, the shape of the piezoelectric diaphragm, which is supported by the side wall, in plan view, and the shape of the support member in plan view may be changed to various shapes.

Note that, although the piezoelectric diaphragm has been described as a diaphragm in the above-described embodiments, the diaphragm according to the present invention is not limited to the piezoelectric diaphragm. For example, a diaphragm that is driven by a magnet coil may be used.

In the foregoing description, and in the following claims, the terms "top," "bottom" and "side" are used. These are relative terms intended to define the relative positioning the various walls of the case. Thus, for example, the "top" plate 3 in FIG. 1 could easily be oriented to face downward or sideways relative to the orientations of the drawings.

The invention claimed is:

1. A sound generating device comprising:
   a case that includes a top wall and a side wall extending downwardly from the top wall;
   a diaphragm fixed to an inner surface of the case at a location spaced from the top wall and cooperating with the top wall and the side wall to bound an air chamber; and
   a sound emitting hole fluidly coupled to the air chamber and allowing air in the air chamber to escape the sound generating device both in a direction above the top wall and in a direction extending laterally of the side wall.

2. The sound generating device according to claim 1, wherein the sound emitting hole is fluidly coupled to the air chamber by a duct.

3. The sound generating device according to claim 2, wherein the duct extends along the side wall of the case.

4. The sound generating device according to claim 3, wherein at least a portion of the duct protrudes laterally outward from the side wall of the case.

5. The sound generating device according to claim 2, wherein the duct extends along the top wall of the case.

6. The sound generating device according to claim 2, wherein the duct has a rectangular cross section.

7. The sound generating device according to claim 2, wherein the duct includes first and second opposed walls, one of the opposed walls being defined by the top wall of the case.

8. The sound generating device according to claim 1, wherein the side wall has a plurality of planar wall sections and the sound emitting hole extends through at least two of the wall sections.

9. The sound generating device according to claim 8, wherein there are four wall sections and the sound emitting hole extends through two adjacent wall sections at a corner at which the two adjacent wall sections meet.

10. The sound generating device according to claim 1, wherein the diaphragm is a piezoelectric diaphragm that performs bending vibration.

11. The sound generating device according to claim 1, wherein:
    the case has an open bottom end;
    the diaphragm cooperates with a portion of the side wall of the case located between the diaphragm and the open lower end to form a second air chamber; and
    at least one additional sound emitting hole extends through the portion of the side wall of the case located between the diaphragm and the open lower end to allow sound waves located in the second air chamber to exit the case.

12. The sound generating device according to claim 1, wherein:
    the top wall has a rectangular shape having four sides when viewed in plan view, and
    the side wall includes first to fourth side wall portions each extending from a respective one of the sides of the top wall.

13. The sound generating device according to claim 1, wherein:
    the top plate has a circular shape when viewed in plan view, and
    the side wall is a cylindrical side wall.

14. The sound generating device according to claim 1, wherein the sound emitting hole extends from the top surface of the top wall downwardly along the side surface of the side wall by a distance of at least 0.5 mm.

15. A sound generating device comprising:
a case that includes a top wall and a side wall extending downwardly from the top wall;
a diaphragm fixed to an inner surface of the case at a location spaced from the top wall and cooperating with the top wall and the side wall to bound an air chamber;
a sound emitting hole extending through both the top wall and the side wall and being in gaseous communication with the air chamber for allowing sound waves located in the air chamber to exit the case; and
a duct that extends along the side wall of the case from the air chamber to the sound emitting hole and allows sound waves located in the air chamber to travel to the sound emitting hole.

16. The sound generating device according to claim 15, wherein at least a portion of the duct protrudes outward from the side wall of the case.

17. A sound generating device comprising:
a case that includes a top wall and a side wall extending downwardly from the top wall;
a diaphragm fixed to an inner surface of the case at a location spaced from the top wall and cooperating with the top wall and the side wall to bound an air chamber;
a sound emitting hole extending through both the top wall and the side wall and being in gaseous communication with the air chamber for allowing sound waves located in the air chamber to exit the case; and
a duct that extends along the top wall of the case from the air chamber to the sound emitting hole and allows sound waves located in the air chamber to travel to the sound emitting hole.

18. The sound generating device according to claim 17, wherein at least a portion of the duct protrudes above the top wall of the case.

19. The sound generating device of claim 1, wherein the sound emitting hole extends down the side wall between 0.5 mm and 2.0 mm from the top of the top wall.

* * * * *